United States Patent [19]

Hopkinson

[11] Patent Number: 4,939,645

[45] Date of Patent: Jul. 3, 1990

[54] METHOD AND APPARATUS TO REDUCE TRANSFORM COMPRESSION VISUAL ARTIFACTS IN MEDICAL IMAGES

[75] Inventor: James F. Hopkinson, Vernon Hills, Ill.

[73] Assignee: Kabushiki Kaisha Toshiba, Kanagawa, Japan

[21] Appl. No.: 242,364

[22] Filed: Sep. 9, 1988

[51] Int. Cl.⁵ ............................................ G06F 15/48
[52] U.S. Cl. ................................ 364/413.19; 378/901
[58] Field of Search ........................... 364/413.19, 726; 358/133; 382/41–43; 378/901

[56] References Cited

U.S. PATENT DOCUMENTS 4,654,484  3/1987  Reiffel et al. ...................... 358/133
4,809,350  2/1989  Shimoni et al. .................... 358/133
4,835,607  5/1989  Keith ................................. 358/133

Primary Examiner—Jerry Smith
Assistant Examiner—Gail O. Hayer
Attorney, Agent, or Firm—Finnegan, Henderson, Farabow, Garrett and Dunner

[57] ABSTRACT

A method and apparatus for reducing visual artifacts in medical images reconstructed from compressed imaging data by the approximation of image data rejected during compression. Rejected data is modeled by a statistical distribution such as the Gaussian distribution. The standard deviation of the rejected data is stored with the not-rejected, compressed data. During image reconstruction, the standard deviation is used to approximate the data rejected during compression, and thus to approximate the original image with substantial reduction of visual artifacts.

26 Claims, 5 Drawing Sheets

METHOD AND APPARATUS TO REDUCE TRANSFORM COMPRESSION VISUAL ARTIFACTS IN MEDICAL IMAGES

BACKGROUND OF THE INVENTION

I. Field of the invention

This invention relates to computerized tomography and more particularly to compression and recovery of medical imaging data.

II. Description of the related art

Medical imaging requires the generation, processing, and storage of prodigious quantities of digital image data. Digital image compression is employed to represent an image by using as few bits as possible consistent with a high degree of image fidelity, with the goals of reducing data processing and transmission time and reducing data storage space requirements.

Compression algorithms attempt to produce a representation of a given image in terms of uncorrelated data samples. Data representing a spatial characteristic of the image, such as image intensity as a function of position, are highly correlated, that is, given information about some data values, other data values can be interpolated. There is, therefore, redundant information in spatial image data which prevents maximum data compression for a given image quality.

Digital image compression balances the degree of compression against the degradation of the reconstructed image, i.e., the image generated from the compressed and then decompressed data. Transform compression of image data is one method of obtaining high compression ratios with only modest image degradation. The compression ratio is the ratio of the number of data bits needed to represent the uncompressed image divided by the number of data bits needed to represent the same image in a compressed format. Typical of such ratios would be 20 bits compressed to 1 bit, written as 20:1.

Compression is also described in terms of bits per pixel. Typically, 10 data bits represent one medical image pixel. Lossless compression techniques are capable of achieving a reduction to about 4.0 bits per pixel. However it is desirable to employ transform coding procedures to produce images compressed at a coding rate of 0.5 bits per pixel. At this lower limit image smoothing results from the loss of high frequency information. Also, compression methods that break images into many subimages, or blocks, may accentuate subimage discontinuities at the subimage boundaries. Finally, procedures which perform compression by selecting only the most dominant topographic features within image blocks may randomly choose some subset of components representative of the noise content. Upon decompression, this partial information can result in the appearance of subjectively objectionable spurious medium-to-high frequency two dimensional patterns.

Typical solutions to these image degradation problems involve reduction in the compression ratio to retain more of the image details or application of image processing techniques to restore degraded images. Each of these solutions detracts from the stated goals of data compression by increasing data storage requirements, increasing processing times, increasing data transmission times, or all of the three. In some cases, such as in computation methods to improve the appearance of block edge boundaries, intrablock artifacts may be introduced. Thus the solution to a first problem results in the introduction of a second problem.

It is therefore an object of the present invention to provide a method and apparatus to substantially reduce visual artifacts in reconstructed medical image data without substantially increasing data storage or processing time requirements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purposes of the invention as embodied and broadly described herein, a method is provided for substantially reducing visual artifacts resulting from transform compression of image data, comprising the steps of transforming spatial image data into spectral image data representing the frequency content and amplitude of the spatial image data; rejecting those of the spectral image data having selected frequency and amplitude characteristics; computing at least one parameter which characterizes the rejected spectral image data in terms of a selected mathematical model; encoding not-rejected spectral image data for data compression; storing on a data storage device the encoded data and the parameter; decoding the encoded spectral image data; and generating an approximation of the rejected spectral image data by application of the parameter to the model.

In a preferred embodiment, there is also provided a method for transforming the spectral data into spatial data, and reconstructing the original image.

It is also preferable that an apparatus be provided to reduce visual artifacts resulting from the transform compression of image data.

The accompanying drawings, which are incorporated in and constitute a part of the specification, illustrate a preferred embodiment of the invention and, together with the general description given above and the detailed description of the preferred embodiment given below, serve to explain the principles of the invention.

DESCRIPTION OF THE PREFERRED EMBODIMENT

Reference will now be made in detail to the present preferred embodiment of the invention as illustrated in the accompanying drawings.

Figure 1:
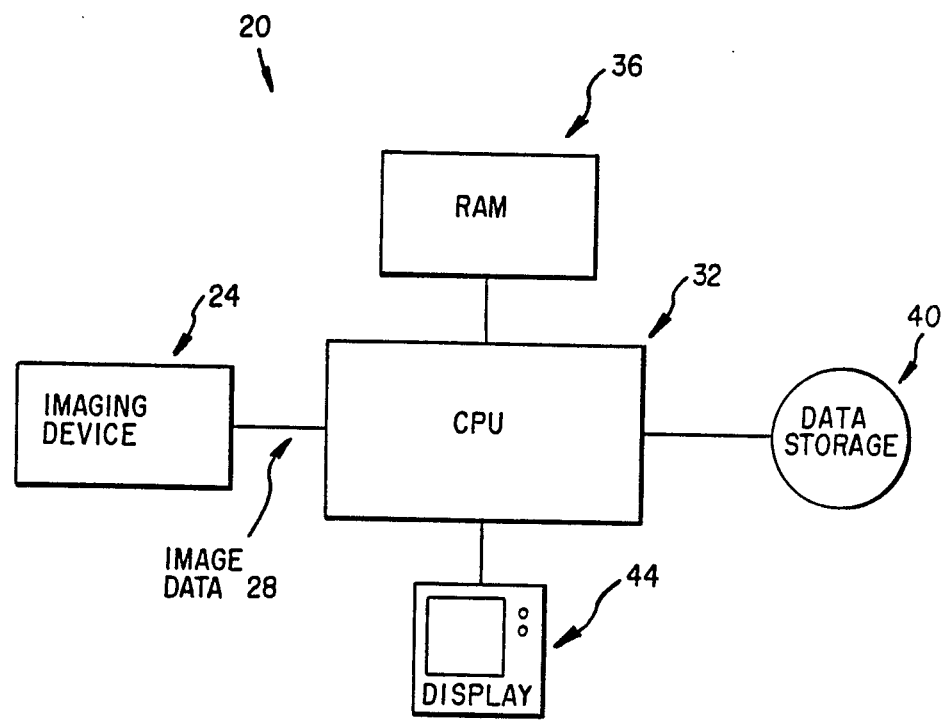
FIG. 1 is an example of a medical imaging apparatus to perform the image data compression and reconstruction of the present invention.

Medical imaging system 20 of FIG. 1 is shown by way of example and not as a limitation as comprising an imaging device 24, central processing unit (CPU) 32, random access memory (RAM) 36, data storage unit 40, and display device 44.

Figure 2:
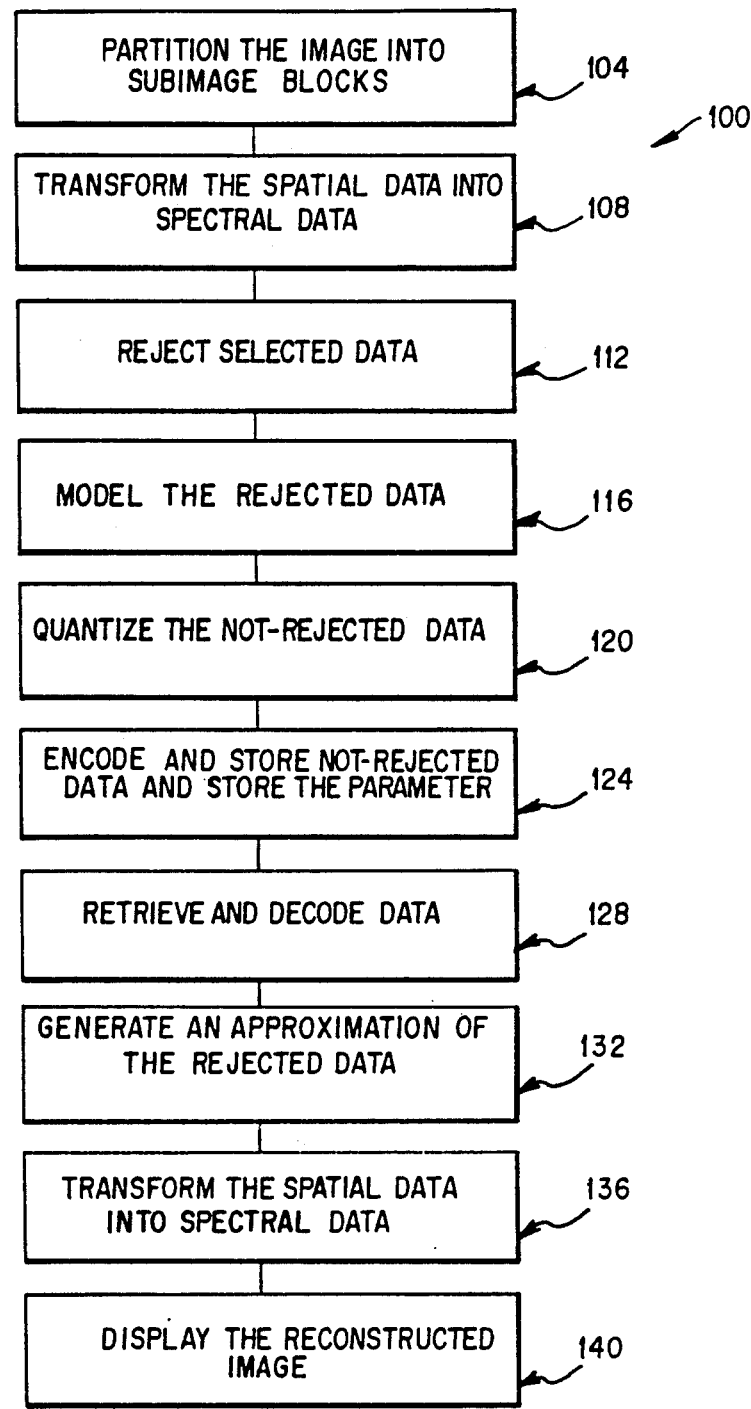
FIG. 2 is a flow chart of the image data and reconstruction process performed by the apparatus of FIG. 1.

Imaging device 24 produces spatial image data 28 which is processed by CPU 32 as shown by the steps of flowchart 100 of FIG. 2. RAM 36 temporarily stores the necessary programs and data needed by CPU 32 during processing of image data 28. Data storage unit 40, preferably a high capacity disk drive, permanently stores processed data. Display device 44, preferably a visual display unit, displays visual images generated by CPU 32 from reconstructed spatial image data stored on storage device 40.

Flowchart 100 of FIG. 2 presents the basic steps performed by CPU 32 to transform, compress, reconstruct, and display spatial image data 28. Spatial image data 28 comprises a plurality of data values. Each data value, represented by 10 binary digits in the preferred embodiment, represents one pixel, or picture element. One image comprises many pixels.

Imaging system 20 compresses spatial imaging data 28 to minimize data storage space, transmission time and processing time requirements by partitioning the image data into spatial subimage data blocks of a given size, step 104, transforming the spatial subimage data into spectral subimage data, step 108, rejecting selected spectral subimage data, step 112, modeling the rejected data, step 116, quantizing the not-rejected data, step 120, and encoding and storing the not-rejected data and at least one parameter characterizing the rejected data in terms of the model, step 124.

Imaging system 20 reconstructs an approximation of image data 28 from the stored data by retrieving the parameter or parameters characterizing the rejected subimage data in terms of the model and retrieving and decoding the encoded data, step 128, generating an approximation of the rejected data based on the retrieved parameter or parameters and the model, step 132, transforming the spectral subimage data into spatial subimage data, step 136, and generating an image from the reconstructed image data, step 140, for display on visual display unit 44.

Turning now to a detailed discussion of image compression and reconstruction, let $\bar{F}$ represent a matrix of the values of spatial image data 28 in two dimensions. Partitioning $\bar{F}$ into a set of $\bar{f}$ square subimages, step 104 of flowchart 100, results in a set of spatial subimage blocks of some chosen dimension. Experimental evidence indicates that block sizes of 16 by 16 or 32 by 32 pixels is optimum, that is, smaller block sizes result in image quality degradation following compression. Larger block sizes increase computational complexity but have minimal effect on reconstructed image quality. A block size of 256 pixels is chosen in the preferred embodiment as a convenient size to balance the complexity of subsequent computations against the quality of the reconstructed image, however, the present invention could be applied to blocks of any suitable size.

Application of an orthogonal transformation matrix $\bar{T}$ to the spatial subimage data, step 108, produces a spectral representation of the spatial information contained in the block, as follows:

$$\bar{f}' = \bar{T} \bar{f} \bar{T}^\tau, \quad (1)$$

where $\bar{T}^\tau$ is the transpose of T.

The transform of the preferred embodiment of the invention is a discrete cosine transform (DCT) because of its computational simplicity and decorrelation and energy packing capabilities. The matrix elements of the DCT are defined by:

$$T_{ij} = (2C(j)/N) \cos[\pi(i+\tfrac{1}{2})j/N],$$

where $T_{ij}(2C(j)/N)\cos[\pi(i + \tfrac{1}{2})j/N]$, where $$C(j) = 1/\sqrt{2} \quad \text{if } j = 0$$
$$= 1 \quad \text{otherwise}$$

N = the number of data values to transform, i.e., the number of data values in a row or column of $\bar{f}$.

Figure 3:
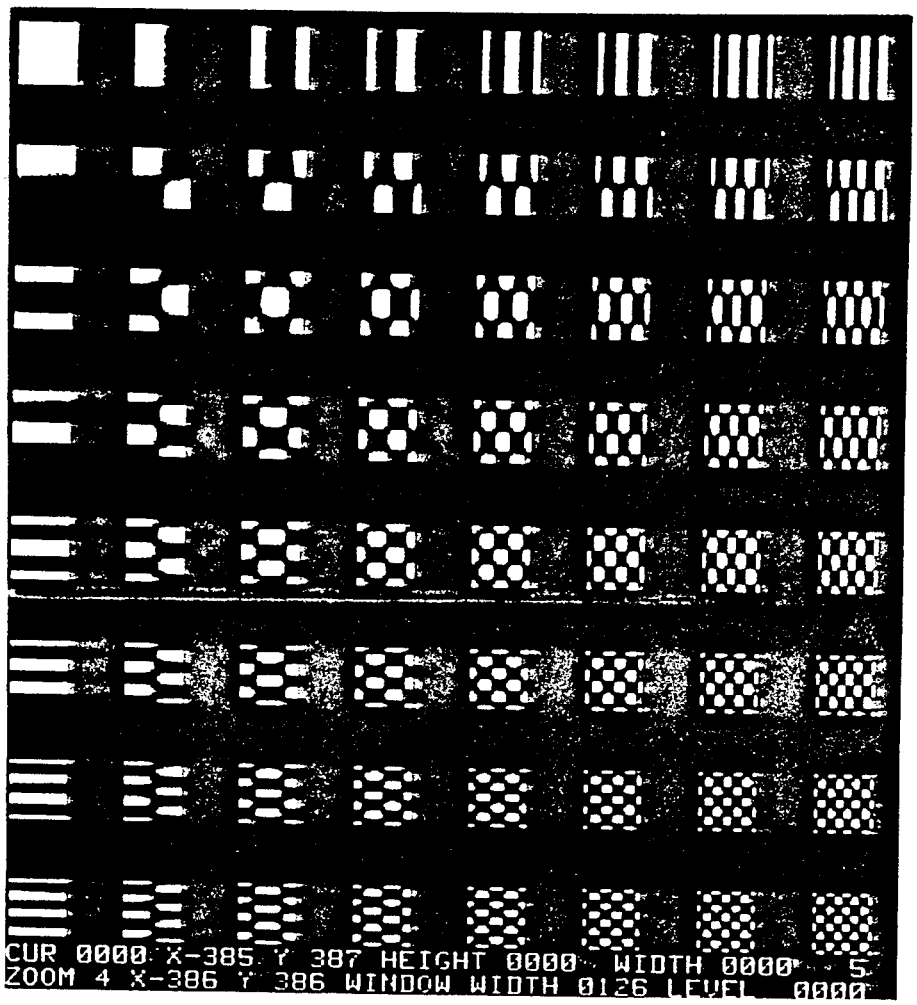
FIG. 3 is a subimage block of basis images.

The matrix of spectral subimage data, $\bar{f}'$, of the transformed spatial subimage data are the amplitudes of the frequency components present in the spatial subimage. The actual data values of $\bar{f}'$ are amplitudes of respective two dimensional frequency dependent basis images. FIG. 3 is an example of such basis images. Each element of $\bar{f}'$ is the amplitude, or weight, to be assigned to each of the basis images which, when weighted and superposed, represent the spectral content of $\bar{f}$. The data elements of $\bar{f}'$ are also less correlated than the elements of $\bar{f}$, which makes them useful for data compression.

If the subimage energy is defined as:

$$E(\bar{f}) = \sum_{j,k} f^2(j,k),$$

where (j,k) are the indices of the data values within the subimage block (or matrix of data values, $\bar{f}$), then $E(\bar{f}) = E(\bar{f}')$, which means the orthogonal transform preserves total energy. However, transforms useful for data compression have the property that the energy is not uniformly distributed. Rather, relatively few of the low frequency components, i.e., the simplest basis images of FIG. 3, contain most of the block energy and are the most heavily weighted. Thus, to store the most salient spatial features of $\bar{f}$, only the low frequency components of $\bar{f}'$ must be stored. The higher frequency components contain information about edge detail fine structure, and noise in the original spatial subimage block.

Because of the requirement for compression, certain data in $\bar{f}'$ must be rejected. Also, the not-rejected spectral subimage data must be limited in the number of significant digits stored. If all the frequency components in all the spectral subimage blocks were stored, and were stored with the number of significant digits as the original data, the reconstructed image would be essentially identical to the original image, but this is not consistent with adequate compression ratios. High frequency components are, therefore, more readily discarded because they contain the fine detail of the image, but in so doing, some detail is lost.

Compression is obtained by rejecting spectral subimage data having selected frequency and amplitude characteristics. In the preferred embodiment of the invention, as shown by way of example and not as a limitation, frequency components having specific amplitudes are rejected in step 112 of flowchart 100, using an adaptive selection method with threshold coding in a manner well known in the art.

In the adaptive selection method, the decision to reject data is based on the selected compression ratio for the data. A threshold value is selected, and amplitudes with an absolute value less than this selected threshold are rejected. Amplitudes equal to or greater than the threshold are retained for quantization and coding, to be discussed below.

In accordance with the invention, at least one parameter characterizing the rejected spectral subimage data in terms of a selected mathematical model is computed. This step of computing is shown by way of example and not as a limitation in step 116 of flowchart 100 as comprising (1) selecting a model for the distribution of the rejected amplitudes, and (2) determining the standard deviation of the data in terms of the selected model.

Much of the information contained in the rejected spectral subimage data can be modeled, and because the model defines the rejected data, only the parameters characterizing the data in terms of the model need be computed, coded and stored with the not-rejected spectral subimage data. Later, when the image is to be reconstructed, an approximation of the rejected data may be calculated by application the stored parameter to the model to generate statistical samples of the rejected amplitudes. This reduces the data storage space required for accurate reconstruction of the original image without the aforementioned visual artifacts.

Figure 4:
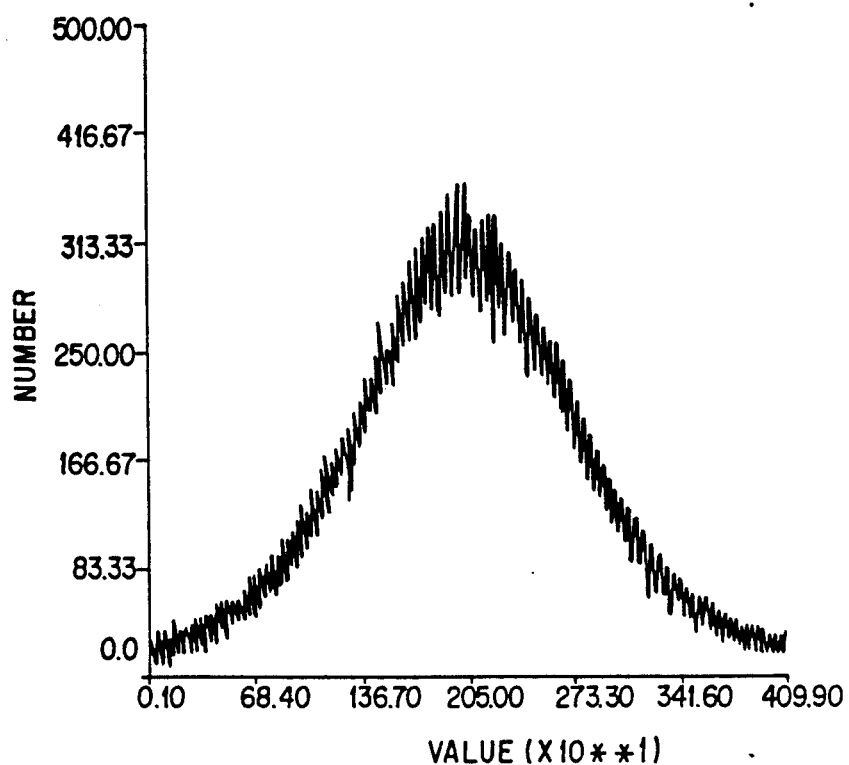
FIG. 4 is a plot of the number of rejected spectral subimage amplitudes versus the amplitude value.

FIG. 4 shows a probability distribution of deleted amplitudes of f' in a typical medical image. The number of rejected amplitudes is shown on the vertical axis and the value of the deleted amplitudes is shown on the horizontal axis. The distribution of the rejected amplitudes conforms to a Gaussian function of the following form:

$$p(x) = \sqrt{(1/2\pi\sigma^2)} \exp(-x^2/2\sigma^2), \quad (2)$$

where $p(x)$ is the Gaussian probability density, x is the value of the deleted amplitude, and $\sigma^2$ is the variance of x. This distribution requires only the storage of the standard deviation (square root of the variance) of x to reproduce $p(x)$.

It should be noted that other model distributions, such as the Laplacian or the Rayleigh may provide for a more accurate representation of some information, thus the invention should be practiced with a distribution that best models the rejected spectral subimage data of a given image. The invention is thus not limited to a specific model or distribution.

As applied to the present invention, which uses the Gaussian distribution as the selected model in the preferred embodiment, if the value of deleted amplitudes is represented by x, then the standard deviation of the rejected amplitudes provides a complete probabilistic description for the occurrence of the rejected amplitudes. The standard deviation is therefore a parameter which characterizes the rejected data in terms of the particular Gaussian distribution which serves as a mathematical model.

To compute the parameter describing the mathematical model of the rejected spectral subimage data, the number N of amplitudes rejected, the data values $f'_{ij}$ of each rejected amplitude, and the square of each of such data values are accumulated. The variance of the rejected amplitudes is then computed by CPU 32 as:

$$\sigma^2 = <(f'_{ij} - <f'_{ij}>)^2>$$

and the standard deviation is saved, to be appended to the bit stream of the non-rejected amplitudes. The selected mathematical model describing the distribution of the rejected data must also be retained, although it need not be on data storage device 40 with the data. The same model used to select the parameter must be used below to reconstruct the rejected data.

The standard deviation may computed for the entire image or it may be computed for each spectral subimage depending on the needed degree of data compression. If the spectral content of the entire image is fairly constant, the former method may be used without inducing an undue amount of visual artifacts. If the spectral content varies substantially from subimage to subimage, the standard deviation should be computed and stored for each spectral subimage.

The previously described transformation produces as many spectral image data values as spatial image data values. The dynamic range of the non-rejected amplitudes may exceed the range of the spatial image data. To achieve substantial reduction in the data coding rate, all possible values of the spectral subimage data cannot be retained. The data values are therefore quantized, step 120 of flowchart 100, prior to encoding. Quantization reduces the information content in the transform domain by performing a many-to-one mapping of the data values and, thus, permits additional data compression, but results in the introduction of a compression error. This compression error results from the approximation of many data values by a single representative value.

Quantization is performed using a statistical quantization procedure well known in the art, that minimizes clipping artifacts while introducing only minimal quantization error. If y represents the value of a random variable where $y_L \leq y \leq y_H$, and having a quantized value of $\bar{y}$, the probability distribution of y is $p(y)$. A set of decision levels, $d_j$, and a set of reconstruction values, $r_j$ are defined such that:

$$y = r_j \text{ if } d_{j-1} < y < d_j, \text{ and}$$

$$E_Q(r_j, d_j) = \sum_j \int_{d_{j-1}}^{d_j} (y - r_j)^2 p(y) dy$$

is a minimum. $E_Q$ is the mean square quantization error. The solution of this optimal quantization problem results in the following expressions for the placement of the reconstruction and decision levels.

$$r_j = \int_{d_{j-1}}^{d_j} y p(y) dy \bigg/ \int_{d_{j-1}}^{d_j} p(y) dy \text{ and}$$

$$d_j = (r_{j-1} + r_j)/2$$

The first result shows that the reconstruction values should be chosen to be the centroid of the distribution between the corresponding decision levels, while the second result states that the decision levels should be placed halfway between corresponding reconstruction values. These equations may be solved recursively to yield the placement of decision and reconstruction levels that minimizes $E_Q$. This solution satisfies the observation that the decision levels should be more closely spaced in those regions where the sampled values of y are more likely to occur.

Figure 5:
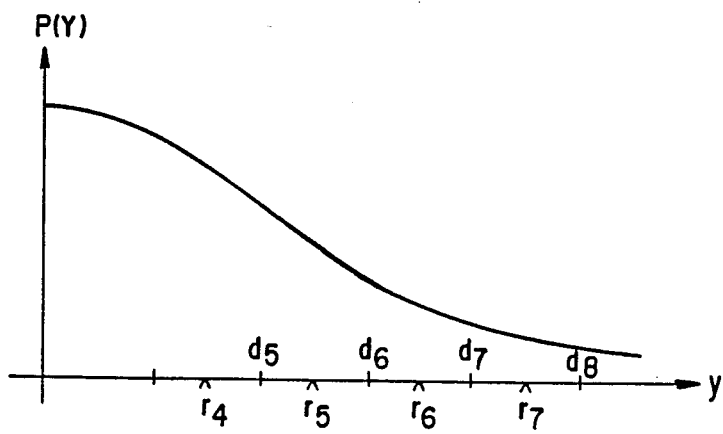
FIG. 5 is a plot of a Gaussian distribution of a quantized variable, y, with decision levels and reconstruction values.

In Gaussian distributions, as shown in FIG. 5, clipping can occur for low probability, large values of y, which correspond to large magnitude spectral subimage data values. This clipping results in edge artifacts. Therefore, in the preferred embodiment of the invention, whenever spatial subimages contain substantial edge detail, which results in large magnitude high frequency amplitudes in the spectral subimage, edge artifacts are avoided without an increase in the quantized bit requirement by uniformly quantizing the data values over their ranges as shown in FIG. 5. Decision levels $d_5-d_8$ and reconstruction values $r_4-r_7$ are shown equally spaced along the y axis. Data values falling between, for example, decision points $d_5$ and $d_6$ are quantized to reconstruction value $r_5$. In so doing, clipping artifacts will have been reduced at the expense of an increase in the overall quantization error.

The final mapping procedure required for data compression is the assignment of code words to the quantized non-rejected data, step 124. Additional compression results from the efficient selection of a set of binary symbols used to represent the set of quantized data. In the preferred embodiment, the Huffman Code is used because it is a proven compact code, but other coding methods, dictated by the complexity of the implementation, may be used to practice the invention.

The compressed data and the parameter describing the mathematical model of the rejected spectral subimage data, consisting in the preferred embodiment of coded and quantized non-rejected spectral subimage data and the standard deviation of the rejected spectral subimage data, are stored on data storage device 40 of FIG. 1, thus completing the data compression and storage process.

To view the original image on display device 44, CPU 32 must retrieve the stored standard deviation and encoded data from data storage device 40, decode the data, estimate the rejected subimage data, given the mathematical model and the parameter describing the model, and reconstruct an approximation of the original image. The Huffman code values are decoded into quantized not-rejected spectral subimage data in a manner well known in the art, step 128 of flowchart 100.

In accordance with the invention, an approximation of the rejected spectral subimage data is generated by application of the retrieved parameter to the mathematical model of the rejected spectral subimage data. In the preferred embodiment, presented by way of example and not as a limitation, approximation of the rejected spectral subimage data comprises generating a sample of a random variable having a Gaussian distribution and having a standard deviation of one. The value of this sample is multiplied by the retrieved standard deviation to produce a statistical estimate of the rejected amplitude. This statistical estimate of the data value is then included with the decoded spectral subimage data.

In practice, a table of random numbers having a Gaussian distribution and a standard deviation of one is generated. To replace a rejected spectral subimage data value, a number is chosen at random from the table. The chosen number is multiplied by the retrieved parameter, which in the preferred embodiment is the standard deviation of the rejected subimage data. The resulting product, called a replacement amplitude, is a statistical estimate of the rejected spectral subimage data. This is true because the distribution of the numbers in the table is Gaussian, as is the distribution of the rejected amplitudes. The replacement amplitude, therefore, statistically replaces the image information lost during the compression process. The replacement amplitude is inserted into the decoded data stream at the location of the rejected amplitudes, resulting in the formation of $\bar{f}_q'$, an approximation of $\bar{f}$.

The inverse transform of $\bar{f}_q'$ is performed, step 138 of flowchart 100:

$$\bar{f} = \bar{T}^r \bar{f}_q' \bar{T},$$

producing a spatial subimage block from which an approximation $\bar{F}q$ of the original image $\bar{F}$ data values is reconstructed for display, step 140, on display device 44 of FIG. 1.

Additional advantages and modifications will readily occur to those skilled in the art. The invention in its broader aspects is, therefore, not limited to the specific details, representative apparatus and illustrative example shown and described. Accordingly, departures may be made from such details without departing from the spirit or scope of applicant's general inventive concept.

What is claimed is:

1. A method for substantially reducing visual artifacts resulting from transform compression of image data, comprising the steps of:

transforming spatial image data into spectral image data representing the frequency content and amplitude of said spatial image data;

rejecting those of said spectral image data having selected frequency and amplitude characteristics;

computing at least one parameter which characterizes said rejected spectral image data in terms of a selected mathematical model;

encoding not-rejected spectral image data for data compression;

storing on a data storage device said encoded data and said parameter;

decoding said encoded spectral image data; and generating an approximation of said rejected spectral image data by application of said parameter to said model.

2. The method of claim 1 wherein said step of computing includes computing at least one parameter which characterizes said rejected spectral image data in terms of a Gaussian distribution.

3. The method of claim 1 wherein said step of computing includes computing a standard deviation of said rejected spectral image data.

4. The method of claim 1 wherein said step of generating includes randomly selecting numbers from a number table, said numbers in said table having a distribution conforming to said mathematical model.

5. The method of claim 4 wherein said mathematical model is a Gaussian distribution and said numbers in said table have a standard deviation of one.

6. The method of claim 1 further comprising the steps of:

transforming said decoded spectral image data and said approximated rejected spectral image data into an approximation of said spatial image data; and displaying an image derived from said approximated spatial image data.

7. A method for substantially reducing visual artifacts resulting from transform compression of medical image data, comprising the steps of:

partitioning the image data into a plurality of spatial subimages having spatial subimage data;

transforming said spatial subimage data into spectral subimage data representing the frequency content and amplitude of said spatial subimage data;

rejecting those of said spectral subimage data having selected frequency and amplitude characteristics;

computing at least one parameter which characterizes said rejected spectral subimage data in terms of a selected mathematical model.

encoding not-rejected spectral subimage data for data compression;

storing on a data storage device said encoded data and said parameter;

decoding said encoded spectral subimage data; and generating an approximation of said rejected spectral subimage data by application of said parameter to said model.

8. The method of claim 7 wherein said step of computing includes computing at least one parameter which characterizes said rejected spectral subimage data in terms of a Gaussian distribution.

9. The method of claim 7 wherein said step of computing includes computing a standard deviation for the rejected data of each of said spectral subimages.

10. The method of claim 7 wherein said step of computing includes computing a standard deviation for all said rejected spectral image data.

11. The method of claim 7 wherein said step of generating includes randomly selecting numbers from a table, said numbers in said table having a distribution conforming to said mathematical model.

12. The method of claim 11 wherein said mathematical model is a Gaussian distribution and said numbers in said table have a standard deviation of one.

13. The method of claim 7 further comprising the steps of:

transforming said decoded spectral subimage data and said approximated rejected spectral subimage data into an approximation of said spatial subimage data; and displaying an image derived from said approximated spatial image data.

14. An apparatus for substantially reducing visual artifacts resulting from transform compression of medical image data, comprising:

means for transforming spatial image data into spectral image data representing the frequency content and amplitude of said spatial image data;

means for rejecting those of said spectral image data having selected frequency and amplitude characteristics;

means for computing at least one parameter which characterizes said rejected spectral image data in terms of a selected mathematical model.

means for encoding not-rejected spectral image data for data compression;

a data storage device for storing said encoded data and said parameter;

means for decoding said encoded spectral image data; and means for generating an approximation of said rejected spectral image data by application of said parameter to said model.

15. The apparatus of claim 14 wherein said means for computing includes means for computing at least one parameter which characterizes said rejected spectral image data in terms of a Gaussian distribution.

16. The apparatus of claim 14 wherein said means for computing includes means for computing a standard deviation for said rejected spectral image data.

17. The apparatus of claim 14 wherein said means for generating includes means for randomly selecting numbers from a table, said numbers in said table having a distribution conforming to said mathematical model.

18. The apparatus of claim 17 wherein said mathematical model is a Gaussian distribution and said numbers in said table have a standard deviation of one.

19. The apparatus of claim 14 further comprising:

means for transforming said decoded spectral image data and said approximated rejected spectral image data into an approximation of said spatial image data; and means for displaying an image derived from said approximated spatial image data.

20. An apparatus for substantially reducing visual artifacts resulting from transform compression of medical image data, comprising:

means for partitioning the image data into a plurality of spatial subimages having spatial subimage data;

means for transforming said spatial subimage data into spectral subimage data representing the frequency content and amplitude of said spatial subimage data;

means for rejecting those of said spectral subimage data having selected frequency and amplitude characteristics;

means for computing at least one parameter which characterizes said rejected spectral subimage data in terms of a selected mathematical model;

means for encoding not-rejected spectral subimage data for data compression;

a data storage device for storing said encoded data and said parameter;

means for decoding said encoded spectral subimage data; and means for generating an approximation of said rejected spectral subimage data by application of said parameter to said model.

21. The apparatus of claim 20 wherein said means for computing includes means for computing at least one parameter which characterizes said rejected spatial subimage data in terms of a Gaussian distribution.

22. The apparatus of claim 20 wherein said means for computing includes means for computing a standard deviation for the rejected data of each of said spectral subimages.

23. The apparatus of claim 20 wherein said means for computing includes means for computing a standard deviation for all said rejected spectral subimage data.

24. The apparatus of claim 20 wherein said means for generating includes means for randomly selecting numbers from a table, the numbers in said table having a distribution conforming to said mathematical model.

25. The apparatus of claim 24 wherein said mathematical model is a Gaussian distribution and said numbers in said table have a standard deviation of one.

26. The apparatus of claim 20 further comprising:

means for transforming said decoded spectral subimage data and said approximated rejected spectral subimage data into an approximation of said spatial subimage data; and means for displaying a subimage derived from said approximated spatial subimage data.

* * * * *